United States Patent [19]

Hato

[11] Patent Number: 5,318,952
[45] Date of Patent: Jun. 7, 1994

[54] A SUPERCONDUCTING TRANSISTOR WHEREIN HOT ELECTRONS ARE INJECTED INTO AND TRAPPED FROM THE BASE

[75] Inventor: Tsunehiro Hato, Kawasaki, Japan

[73] Assignee: Fujitsu Limited, Kawasaki, Japan

[21] Appl. No.: 112,806

[22] Filed: Aug. 27, 1993

[30] Foreign Application Priority Data

Dec. 24, 1992 [JP] Japan .................. 4-344896

[51] Int. Cl.[5] .................. H01L 39/22; B05D 5/12; H01B 12/00
[52] U.S. Cl. .................. 505/193; 257/36; 257/38; 257/39; 505/701; 505/702; 427/62
[58] Field of Search .................. 257/36–39; 505/1, 700, 701, 702, 874; 427/62, 63

[56] References Cited

U.S. PATENT DOCUMENTS 4,575,741  3/1986  Frank .................. 257/38
4,837,604  6/1989  Faris .................. 257/36

FOREIGN PATENT DOCUMENTS

| 60-10792 | 1/1985 | Japan. | |
|---|---|---|---|
| 60-68681 | 4/1985 | Japan. | |
| 63-308974 | 12/1988 | Japan | 257/39 |
| 291985 | 3/1990 | Japan | 257/39 |
| 2246286 | 10/1990 | Japan | 257/39 |
| 368182 | 3/1991 | Japan | 257/39 |
| 3274775 | 12/1991 | Japan | 257/39 |
| 9004266 | 4/1990 | World Int. Prop. O. | 257/39 |

Primary Examiner—Rolf Hille
Assistant Examiner—Mahshid Saadat
Attorney, Agent, or Firm—Nikaido, Marmelstein, Murray & Oram

[57] ABSTRACT

A superconducting transistor is provided with a base layer made of a normal conductor metal, an emitter layer made of a superconductor for injecting hot electrons to the base layer, a collector layer made of a superconductor for trapping electrons from the base layer, a first tunnel barrier layer made of an insulator and provided between the base layer and the emitter layer, and a second tunnel barrier layer made of an insulator and provided between the base layer and the collector layer.

10 Claims, 5 Drawing Sheets

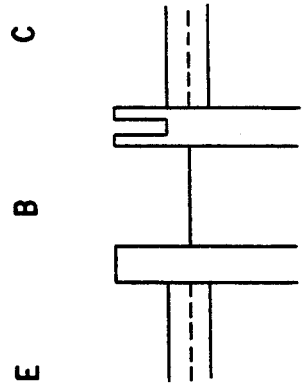
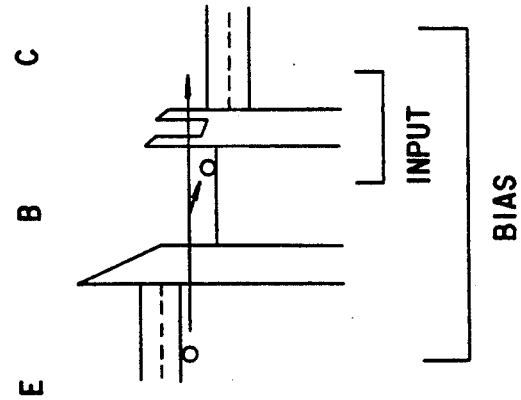
FIG.4(A)
FIG.4(B)
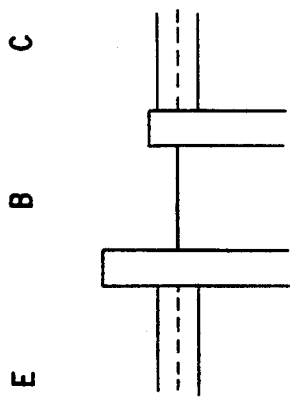
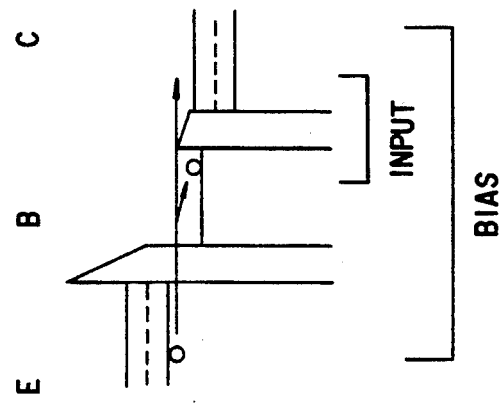
FIG.5(A)
FIG.5(B)

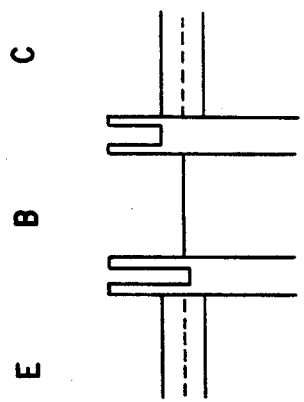
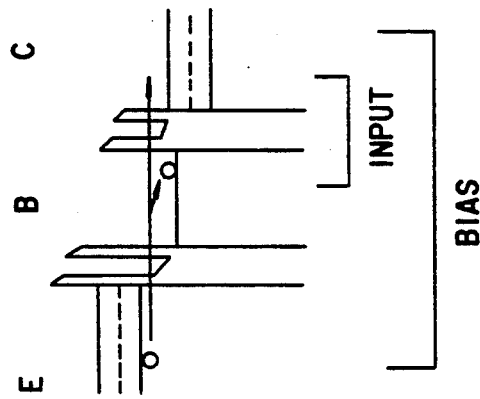
FIG.7(A)
FIG.7(B)
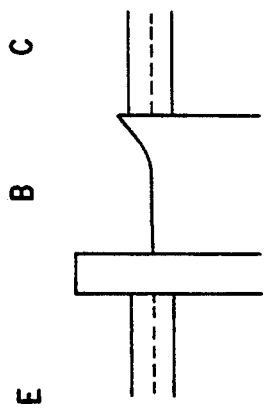
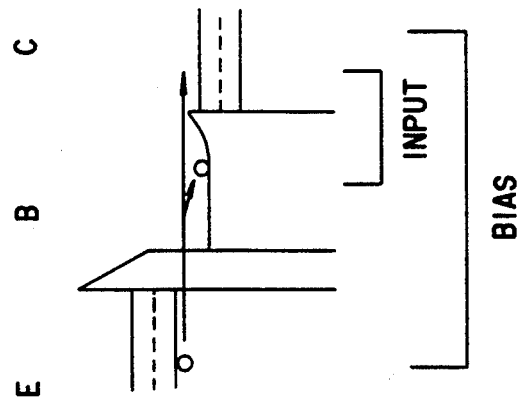
FIG.6(A)
FIG.6(B)

A SUPERCONDUCTING TRANSISTOR WHEREIN HOT ELECTRONS ARE INJECTED INTO AND TRAPPED FROM THE BASE

BACKGROUND OF THE INVENTION

The present invention generally relates to superconducting transistors, and more particularly to a superconducting transistor having a collector and an emitter made of a superconductor.

Recently, in computers and communication equipments, there are demands to carry out signal processing at higher speeds. Hence, much attention has been made on superconducting devices such as a Josephson device. In addition, various superconducting transistors have been proposed to replace the Josephson device.

Among previously proposed superconducting transistors, there is a superconducting transistor having a base made of a superconductor.

For example, in a superconducting transistor proposed in a Japanese Laid-Open Patent Application No.60-68681, an emitter, a base and a collector are all made of a superconductor. An insulator is provided as a barrier between the emitter and the base and between the base and the collector. In other words, this previously proposed superconducting transistor has the so-called SISIS structure, where the "S" stands for "superconductor" and "I" stands for insulator.

On the other hand, a superconducting transistor proposed in a Japanese Laid-Open Patent Application No.60-10792 has an emitter and a base which are made of a superconductor. A collector is made of a normal conductor. In addition, an insulator is provided as a barrier between the emitter and the base and between the base and the collector. Hence, this previously proposed superconducting transistor has the so-called SISIN structure, where the "S" stands for "superconductor", "I" stands for "insulator" and "N" stands for "normal conductor".

According to superconducting transistor having the SISIS structure, the base is made of the superconductor and the Josephson junction is provided in duplicate. For this reason, a current-voltage characteristic of this superconducting transistor has a hysteresis curve for reasons similar to those in the case of the Josephson device. Accordingly, in order to return the state of this superconducting transistor from the voltage state to the superconducting state, the current must be decreased to zero, and there is a problem in that it is difficult to operate this superconducting transistor by a D.C. power supply. In addition, because the base is made of the superconductor and the energy band in the base region has no inclination, the reflection of electrons at the base-collector barrier is notable, and there is a problem in that this notable reflection introduces undesirable effects on the operation of the superconducting transistor.

On the other hand, according to the superconducting transistor having the SISIN structure, the collector is made of the normal conductor. Hence, even though the wiring with respect to the emitter can be formed by a superconductor, there is a problem in that a satisfactory contact cannot be obtained between the superconductor and the normal conductor if the wiring with respect to the collector is formed by the superconductor. On the other hand, if the collector is made thin in order to improve the operation speed of the superconducting transistor, there is a problem in that the collector, although made of the normal conductor, acts as a superconductor due to the proximity effect of the superconductor which forms the base if the collector is made of a metal. Further, if the normal conductor forming the collector is a semiconductor, the Schottky barrier formed between the base and the collector causes a problem. If the collector acts as the superconductor, the problems of the above SISIS structure are introduced. Moreover, if the Schottky barrier is formed between the base and the collector, there is a problem in that the signal amplifying function of the superconducting transistor deteriorates.

SUMMARY OF THE INVENTION

Accordingly, it is a general object of the present invention to provide a novel and useful superconducting transistor in which the problems described above are eliminated.

Another and more specific object of the present invention is to provide a superconducting transistor comprising a base layer made of a normal conductor metal, an emitter layer made of a superconductor, injecting hot electrons to the base layer, a collector layer made of a superconductor, trapping electrons from the base layer, a first tunnel barrier layer made of an insulator, provided between the base layer and the emitter layer, and a second tunnel barrier layer made of an insulator, provided between the base layer and the collector layer. According to the superconducting transistor of the present invention, it is possible to operate the superconducting transistor by a D.C. power supply. In addition, it is possible to obtain a desired signal amplifying function using a simple construction at a low power consumption.

Other objects and further features of the present invention will be apparent from the following detailed description when read in conjunction with the accompanying drawings.

BRIEF DESCRIPTION OF THE DRAWINGS

FIG. 4 in parts (A) and (B) shows an energy band diagram for explaining a fourth embodiment of the superconducting transistor according to the present invention;

FIG. 5 in parts (A) and (B) shows an energy band diagram for explaining a fifth embodiment of the superconducting transistor according to the present invention;

FIG. 6 in parts (A) and (B) shows an energy band diagram for explaining a sixth embodiment of the superconducting transistor according to the present invention; and FIG. 7 in parts (A) and (B) shows an energy band diagram for explaining a seventh embodiment of the superconducting transistor according to the present invention.

DESCRIPTION OF THE PREFERRED EMBODIMENTS

First, a description will be given of the operating principle of the present invention, by referring to FIG. 1.

Figure 1A:
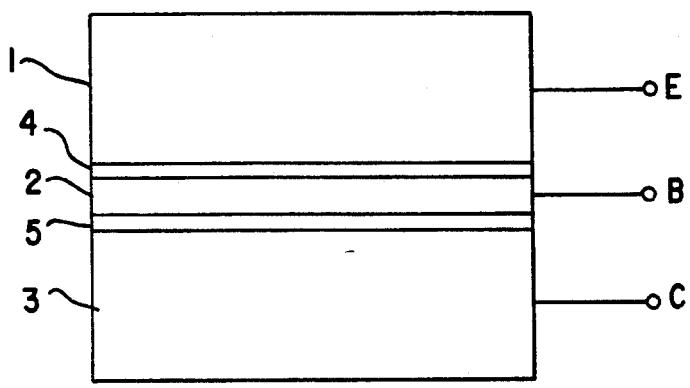
FIG. 1 in parts (A) and (B) is a diagram for explaining the operating principle of the present invention and a first embodiment of a superconducting transistor according to the present invention.
Figure 1B:
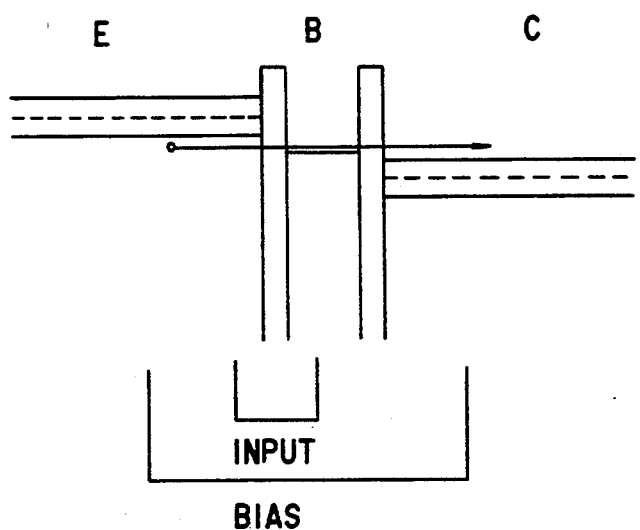

As shown in FIG. 1 (A), a superconducting transistor according to the present invention includes an emitter layer 1 made of a superconductor, a base layer 2 made of a normal conductor metal, a collector layer 3 made of a superconductor, a first tunnel barrier layer 4 made of an insulator and provided between the base layer 2 and the emitter layer 1, and a second tunnel barrier layer 5 made of an insulator and provided between the base layer 2 and the collector layer 3. An emitter terminal E is connected to the emitter layer 1, a base terminal B is connected to the base layer 2, and a collector terminal C is connected to the collector layer 3.

The superconducting transistor shown in FIG. 1 (A) forms an energy band shown in FIG. 1 (B). Since the emitter, base and collector of the superconducting transistor are not made of a semiconductor, no barrier is formed due to a curve of the energy band at the interface.

Because the emitter layer 1 and the collector layer 3 are made of the superconductor, the electron state density is condensed. On the other hand, the base layer 2 is made of the normal conductor metal, and the electron state density is not condensed. For this reason, hot electrons can flow from the emitter layer 1 to the base layer 2 if a bias voltage is applied across the emitter layer 1 and the collector layer 3 as shown in FIG. 1 (B), but the electrons cannot flow from the base layer 2 to the collector layer 3 unless the conduction band of the base layer 2 matches the electron state density of the collector layer 3.

Accordingly, the flow of electrons can be controlled by varying the potential of the base layer 2. In addition, since the superconductor gap is on the order of meV, the electron flow can be controlled on the order of mV.

As a result, the superconducting transistor can be operated by a D.C power supply. In addition, the construction of the superconducting transistor is simple. Furthermore, the superconducting transistor can realize a desired signal amplifying function at a low power consumption.

Next, a description will be given of a first embodiment of the superconducting transistor according to the present invention. The construction of this embodiment is the same as the cross sectional view shown in FIG. 1 (A) described above, and illustration and description thereof will be omitted.

In this embodiment, the thickness of the first tunnel barrier layer between the base layer 2 and the emitter layer 1 is set greater than the thickness of the second tunnel barrier layer 5 between the base layer 2 and the collector layer 3. For example, the thickness of the first tunnel barrier layer 4 is 20 Å, and the thickness of the second tunnel barrier layer 5 is 5 Å. In other words, the voltage divisions between the base and emitter and between the base and collector are determined by the thicknesses of the first and second tunnel barrier layers 4 and 5.

According to this embodiment, the barrier between the base and collector is thin compared to the barrier between the base and emitter. Hence, it is possible to selectively concentrate the bias voltage between the base and emitter so as to increase the energy of the hot electrons flowing into the base layer 2. In addition, it is possible to increase the tunneling probability of the electrons from the base layer 2 to the collector layer 3.

Furthermore, the energy level of the base layer 2 into which the hot electrons flowed can be set to a low energy level less than or equal to the superconducting gap. For this reason, it is possible to guarantee a current which is necessary for the signal amplification by increasing the life of the hot electrons flowing into the base layer 2 (base region) and improving the tunneling probability.

Figure 2:
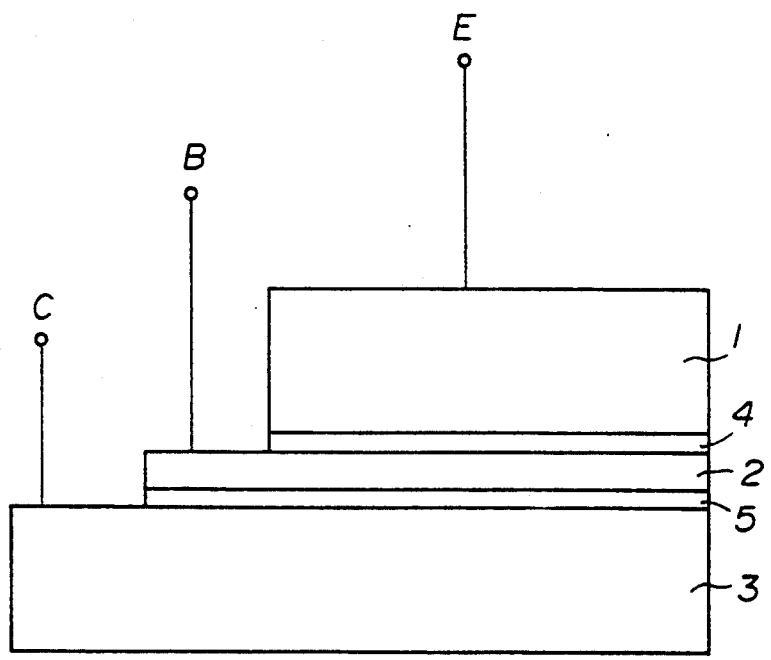
FIG. 2 is a cross sectional view showing a second embodiment of the superconducting transistor according to the present invention.

Next, a description will be given of a second embodiment of the superconducting transistor according to the present invention, by referring to FIG. 2. In FIG. 2, those parts which are the same as those corresponding parts in FIG. 1 are designated by the same reference numerals, and a description thereof will be omitted.

In this embodiment, the area of the emitter electrode is made smaller compared to the area of the base electrode, instead of making the thicknesses of the barriers different. In this case, the base-emitter capacitance is set smaller than the base-collector capacitance. As a result, the voltage division between the base and emitter becomes greater than that between the base and collector, and the bias voltage can be concentrated between the base and emitter, similarly to the first embodiment.

According to this embodiment, it is possible to obtain substantially the same effects as the first embodiment.

Figure 3:
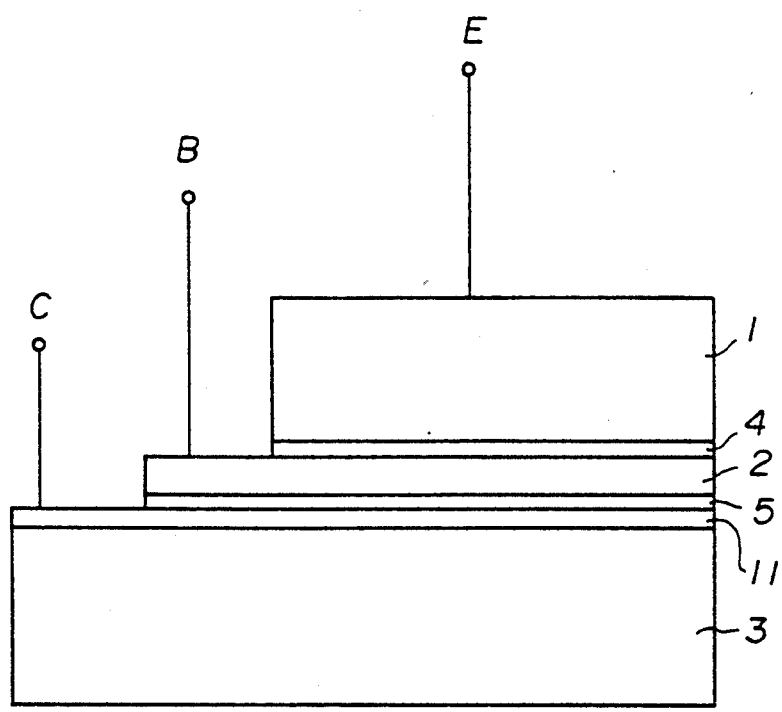
FIG. 3 is a cross sectional view showing a third embodiment of the superconducting transistor according to the present invention.

Next, a description will be given of a third embodiment of the superconducting transistor according to the present invention, by referring to FIG. 3. In FIG. 3, those parts which are the same as those corresponding parts in FIG. 1 are designated by the same reference numerals, and a description thereof will be omitted.

In this embodiment, an Al layer 11 is formed on the collector layer 3, and an $AlO_x$ tunnel barrier layer 5 is formed by oxidizing the top part of the Al layer 11. In addition, the top part of an Al base layer 2 is oxidized to form an $AlO_x$ tunnel barrier layer 4. In other words, this embodiment employs a $(Al-AlO_x)-(Al-AlO_x)$ double structure. Since the Al layer 11 is extremely thin, this Al layer 11 acts as a superconductor due to the proximity effect of the collector layer 3 which is made of the superconductor, and the operation of the superconducting transistor is the same as if no Al layer 11 existed. In addition, since the tunnel barrier layer is formed by oxidizing Al, it is possible to make the superconducting transistor by simple processes.

In FIG. 3, the area of the emitter electrode need not necessarily be made smaller than the area of the base electrode as in the case of the second embodiment. Furthermore, it is of course possible to make the thicknesses of the barriers different, similar to the first embodiment.

In the first through third embodiments described above, the emitter layer 1 and the collector layer 3 are made of a Nb superconductor, for example. However, it is of course possible to use other superconductors for the emitter layer 1 and the collector layer 3.

In the first through third embodiments, it is difficult to obtain a large current density due to the current blocking effect of the barrier, similarly as in the case of the conventional hot electron transistor. Accordingly, a description will now be given of embodiments in which a large current density can be obtained by suppressing the reflection of electrons at the barrier between the base and collector.

FIG. 4 shows an energy band diagram of a fourth embodiment of the superconducting transistor according to the present invention. In this embodiment and fifth through seventh embodiments which will be described later, the superconducting transistor has the construction shown in FIG. 1 or FIG. 2.

In this embodiment, the emitter layer 1 and the collector layer 3 are made of a Nb superconductor, and the base layer 2 is made of Al. The first tunnel barrier layer 4 is made of $AlO_x$, and the second tunnel barrier layer 5 is made of a polycrystalline InSb. Hence, as shown in FIG. 4 (A), the barrier between the base and collector becomes low compared to the barrier between the base and emitter, and the barrier between the base and collector has a height approximately equal to the superconducting gap.

Accordingly, if a bias voltage is applied across the emitter layer 1 and the collector layer 3, the electrons easily tunnel into the collector layer 3 as shown in FIG. 4 (B), and the reflection of the electrons at the barrier between the base and collector is suppressed.

FIG. 5 is an energy band diagram of the fifth embodiment of the superconducting transistor according to the present invention.

In this embodiment, the emitter layer 1 and the collector layer 3 are made of a YBCO oxide superconductor, and the base layer 2 is made of $ReO_3$. The first tunnel barrier layer 4 is made of $CeO_2$, and the second tunnel barrier layer 5 is made of Ca-doped $CeO_2$. Hence, as shown in FIG. 5 (A), an energy level (resonance level) which helps resonance tunneling of the electrons is provided at the barrier between the base and collector. This resonance level is approximately the same height as the superconducting gap.

Accordingly, if a bias voltage is applied across the emitter layer 1 and the collector layer 3, the electrons easily tunnel into the collector layer 3 as shown in FIG. 5 (B), and the reflection of the electrons at the barrier between the base and collector is suppressed.

FIG. 6 is an energy band diagram of the sixth embodiment of the superconducting transistor according to the present invention.

In this embodiment, the emitter layer 1 and the collector layer 3 are made of a Nb superconductor, and the base layer 2 is made of InSb. The first tunnel barrier layer 4 is made of an InSb oxide, and the second tunnel barrier layer 5 is made of a modulation-doped InSb. Hence, the barrier between the base and collector gradually changes as shown in FIG. 6 (A). In other words, the barrier between the base and collector has an inclination at the interface.

Accordingly, if a bias voltage is applied across the emitter layer 1 and the collector layer 3, the electrons easily tunnel into the collector layer 3 as shown in FIG. 6 (B), and the reflection of the electrons at the barrier between the base and collector is suppressed.

FIG. 7 is an energy band diagram of the seventh embodiment of the superconducting transistor according to the present invention.

In this embodiment, the emitter layer 1 and the collector layer 3 are made of a YBCO oxide superconductor, and the base layer 2 is made of $ReO_3$. The first and second tunnel barrier layers 4 and 5 are made of Ca-doped $CeO_3$. Hence, as shown in FIG. 7 (A), an energy level (resonance level) which helps resonance tunneling of the electrons is provided at the barrier between the base and emitter and at the barrier between the base and collector.

Accordingly, if a bias voltage is applied across the emitter layer 1 and the collector layer 3, the electrons easily tunnel into the collector layer 3 as shown in FIG. 7 (B), and the reflection of the electrons at the barrier between the base and collector is suppressed.

In the fourth through seventh embodiments described above, the superconductor used for the emitter layer 1 and the collector layer 3 are of course not limited to those of the described embodiments. In addition, materials such as InAs and InP may be used for the base layer 2 in place of Al or InSb, and materials such as LaSrCuO or Nb-doped SrTiO may be used for the base layer in place of $ReO_3$. Furthermore, a material such as MgO may be used for the first tunneling barrier layer 4 in place of $CeO_3$, and a material such as Nb-doped $CeO_2$ may be used for the second tunneling barrier layer 5 in place of Ca-doped $CeO_2$.

In the normal semiconductor transistor which is presently used in various applications, the input signal level is several hundred mV to several V. However, the input signal level may be several mV for the superconducting transistor according to the present invention. In other words, the superconducting transistor according to the present invention operates in response to an input signal level which is 2 to 3 digits smaller than the input signal level conventionally required to operate the normal semiconductor transistor. For this reason, the present invention can considerably reduce the power consumption of the transistor, increase the switching speed of the transistor, suppress the heat generation from the transistor, and improve the integration density of the transistors. Therefore, the superconducting transistor according to the present invention is extremely useful in realizing the high-speed operation and high density of computers and the like.

The input signal level of the superconducting transistor according to the present invention can be only several mV and small, because the present invention utilizes the condensed electron state density using the superconduction, as described above with respect to the operating principle of the present invention. That is, the present invention utilizes the characteristic of the (superconductor)/(insulator)/(normal conductor metal) structure in which the electron flow suddenly changes in the vicinity of several mV.

In addition, in the superconducting transistor according to the present invention, the energy level of the base into which the hot electron flows is less than or equal to the superconducting gap which is several MeV, for example. Thus, the life of the hot electrons entering the base region is for example 2 mm in distance, and the probability of these hot electrons being trapped in the base region which has a thickness on the order of $\mu m$ is extremely small. As a result, it is possible to obtain a large current density in the superconducting transistor.

It should also be noted that the superconductor wiring can easily be connected to the superconducting transistor according to the present invention, because the emitter layer 1 and the collector layer 3 are made of the superconductor.

Further, the present invention is not limited to these embodiments, but various variations and modifications may be made without departing from the scope of the present invention.

What is claimed is:

1. A superconducting transistor comprising:
   a base layer made of a normal conductor metal;

an emitter layer made of a superconductor, injecting hot electrons to said base layer;

a collector layer made of a superconductor, trapping electrons from said base layer;

a first tunnel barrier layer made of an insulator, provided between said base layer and said emitter layer; and a second tunnel barrier layer made of an insulator, provided between said base layer and said collector layer.

2. The superconducting transistor as claimed in claim 1, wherein said second tunnel barrier layer has a thickness which is smaller than a thickness of said first tunnel barrier layer.

3. The superconducting transistor as claimed in claim 1, wherein an area of an emitter electrode formed by said emitter layer is smaller than an area of a base electrode formed by said base layer.

4. The superconducting transistor as claimed in claim 1, wherein said base layer has an (Al—$AlO_x$)—(Al—$AlO_x$) double structure, said first tunnel barrier layer being formed by one of the $AlO_x$, said second tunnel barrier layer being formed by the other of the $AlO_x$.

5. The superconducting transistor as claimed in claim 1, wherein an energy level of said base layer into which the hot electrons flow if a bias voltage is applied across said emitter layer and said collector layer is less than or equal to a superconducting gap.

6. The superconducting transistor as claimed in claim 1, wherein a barrier formed by said second tunnel barrier layer is lower than a barrier formed by said first tunnel barrier layer, and has approximately the same height as a superconducting gap.

7. The superconducting transistor as claimed in claim 1, wherein said second tunnel barrier layer has a resonance level for causing resonance tunneling of the hot electrons approximately at the same height as a superconducting gap.

8. The superconducting transistor as claimed in claim 1, wherein said second tunnel barrier layer forms a barrier which has an inclination at an interface between said base layer and said collector layer.

9. The superconducting transistor as claimed in claim 1, wherein said first tunnel barrier layer has a resonance level for causing resonance tunneling of the hot electrons.

10. The superconducting transistor as claimed in claim 1, which further comprises means for suppressing reflection of electrons at a barrier which is formed by said second tunnel barrier layer between said base layer and said collector layer.

* * * * *